United States Patent
Lin et al.

(10) Patent No.: US 6,850,036 B2
(45) Date of Patent: Feb. 1, 2005

(54) METHOD FOR CHECKING POWER STATUS OF BATTERIES

(75) Inventors: Hsin-An Lin, No. 90, Sec. 1, Tou-Yuan Rd., Pei-Tou Chen, Changhwa Hsien (TW); Kuo-Hsien Tsai, 3F, No. 31, Chung-Hsin St., Tali City, Taichung Hsien (TW)

(73) Assignees: Handsun Electronic Enterprise Co., Ltd., Taichung (TW); Hsin-An Lin, Changhwa Hsien (TW); Kuo-Hsien Tsai, Taichung Hsien (TW)

( * ) Notice: Subject to any disclaimer, the term of this patent is extended or adjusted under 35 U.S.C. 154(b) by 58 days.

(21) Appl. No.: 10/373,033

(22) Filed: Feb. 26, 2003

(65) Prior Publication Data

US 2004/0164712 A1 Aug. 26, 2004

(51) Int. Cl.[7] .................................................. H02J 7/00
(52) U.S. Cl. ...................................................... 320/127
(58) Field of Search ................................. 320/127, 135, 320/152, DIG. 18, DIG. 21; 324/326–434; 340/636.11, 636.12, 636.13, 636.15, 636.18, 636.19; 702/63

(56) References Cited

U.S. PATENT DOCUMENTS 5,371,682 A * 12/1994 Levine et al. .................. 702/63
5,703,469 A * 12/1997 Kinoshita ............... 340/636.19

* cited by examiner

Primary Examiner—Pia Tibbits
(74) Attorney, Agent, or Firm—Rosenberg, Klein & Lee

(57) ABSTRACT

A method of checking power status of the batteries is disclosed. New batteries are first prepared for discharge tests with different discharge rates, and the standard discharge data for different types of batteries are recorded in a data base for use in power estimation. Afterwards, the battery set installed in an uninterrupted power supply (UPS) system is connected to a monitoring device for continuous monitoring of the test discharge data and discharging time in repeated random discharge tests. The characteristic data including current output, operating temperature, and terminal voltage of the tested battery are then collected and compared with the relevant standard discharge data retrieved from the data base to produce a true estimation of the remaining power of the tested battery.

9 Claims, 3 Drawing Sheets

METHOD FOR CHECKING POWER STATUS OF BATTERIES

BACKGROUND OF THE INVENTION

1. Field of the Invention

The present invention relates to a method for checking the power status, of batteries, in particular to a method that can considerably enhance the estimation of the remaining power of the tested battery.

2. Description of Related Arts

The power for emergency power systems or uninterrupted power supply (UPS) systems generally comes from batteries. When the normal power supply is interrupted, the power source can be automatically switched to an emergency system that is capable of supplying the necessary power during the power outage. It is therefore very important to keep the emergency systems and the storage batteries in top operating conditions at all times. A number of techniques for checking the power status of these batteries have been discussed by prior art patents. One proposed a monitoring device for simultaneously monitoring of the battery characteristic data on several batteries on a continuous basis. These characteristic data include the discharging current, operating temperature, terminal voltage and remaining power capacity. These characteristic data can be accurately measured with an appropriate means except the remaining power capacity. Though important for a battery, the true power status of a battery at any given moment is hard to come by with acceptable confidence. FIG. 4 shows the relationship between the battery capacity and the amount of current output of a typical battery. Using a lead acid cell as an example, high current output of the battery generally results in small battery capacity in ampere/hour. In further analysis of the correlation between the two variables, it is found that the amount of discharging current of the battery is dependent on the electrolysis process of the electrode material with the electrolyte on the inner electrode plates of the battery. When the battery is in a high discharge rate with a large discharging current, $H_2SO_4$ material will tend to accumulate in the gap between the electrode plates where the chemical reaction is taking place, causing the compound material to be changed to $PbSO_4$, thus blocking the infiltration of the compound material to the inner electrode plates, where no chemical reaction takes place. The battery capacity therefore is decreased drastically at the high discharge rate. On the contrary, when the battery is set to a low discharge rate with a small discharging current, $H_2SO_4$ is able to infiltrate to the inner electrode plates by capillary action to allow a complete chemical reaction on all electrode plates, thus the battery capacity is effectively increased. From the above experiment, it is known that the remaining power capacity of a battery tends to be inversely related to the amount of discharging current from a discharging battery.

However, even with the inverse relationship between the remaining power capacity and the discharging current, it is still difficult to come up with an acceptable method of checking the power status for any type of battery. The main problem is that different types of batteries exhibit different characteristics. There are so many types of batteries available, it is impossible to apply the above formula universally to estimate the remaining power capacity.

For a lead acid cell, as an example, the typical potential for chemical reaction is 2V, but the termination voltage will vary in accordance with the amount of current output and the type of battery used, which can be anywhere from 1.671V 1.7V, 1.750V, 1.83V, to 1.9V. The following two cases fully demonstrate that different battery capacity will be produced for different amounts of current output and termination voltage.

Case 1: when the termination voltage is known to be 1.750V, a 2V 1000A/h battery with a discharge rate of 100 A will be able to last for ten hours until the voltage eventually drops to 1.750V.

Case 2: when the termination voltage is known to be 1.832V, a 2V 1000A/h battery with a discharge rate of 250 A will only last for four hours until the voltage eventually drops to 1.832V.

In both cases, even for two batteries with the same specifications and 100% battery capacity, the performance of the batteries will not be the same considering the variables such as the discharging current, battery makes, manufacturing process, and inherent quality, which will all be related to the termination voltage of a battery thus affecting their battery capacity. Also, operating temperature is another factor that may affect the battery capacity. The foregoing experiments only prove that it is grossly inadequate to make any estimation of the remaining power capacity in a battery using a universal formula. Another prior art patent attempted to use the terminal voltage and the amount of discharging current to calculate the discharge rate, which is then multiplied by the amount of discharging current to generate the remaining power capacity of a battery, but does not consider the above mentioned factors that potentially will affect the battery capacity. It is apparent that this is a troublesome aspect for the maintenance of the storage batteries as they have to be kept in top condition at all times to meet the emergency needs.

SUMMARY OF THE INVENTION

The main object of the present invention is to provide a method for checking the power status of the storage batteries with accuracy and in a relatively short time.

The method comprising the steps of:

preparing new batteries of different types for discharge tests;

performing the discharge test on these new batteries for the first time to collect the standard discharge data and save them in a data base for subsequent use in battery tests;

performing random discharge tests on the UPS batteries to collect the discharge data in each operation cycle with a predetermined interval;

comparing and analyzing the discharge data of the tested batteries against the relevant standard discharge data from the data base; and calculating the remaining power in the tested battery basing on the analysis results of the battery characteristic data.

The above mentioned method for checking the power status of a battery has to rely on the standard discharge data with respect to new batteries including their amount of current output and termination voltage. The standard discharge data for the same type of battery are selected from the data base for comparison with the discharge data from the tested battery.

The characteristic discharge data of the tested battery includes the terminal voltage, current output, and ambient temperature.

The features and structure of the present invention will be more clearly understood when taken in conjunction with the accompanying drawings.

DETAILED DESCRIPTION OF THE PREFERRED EMBODIMENT

Figure 1:
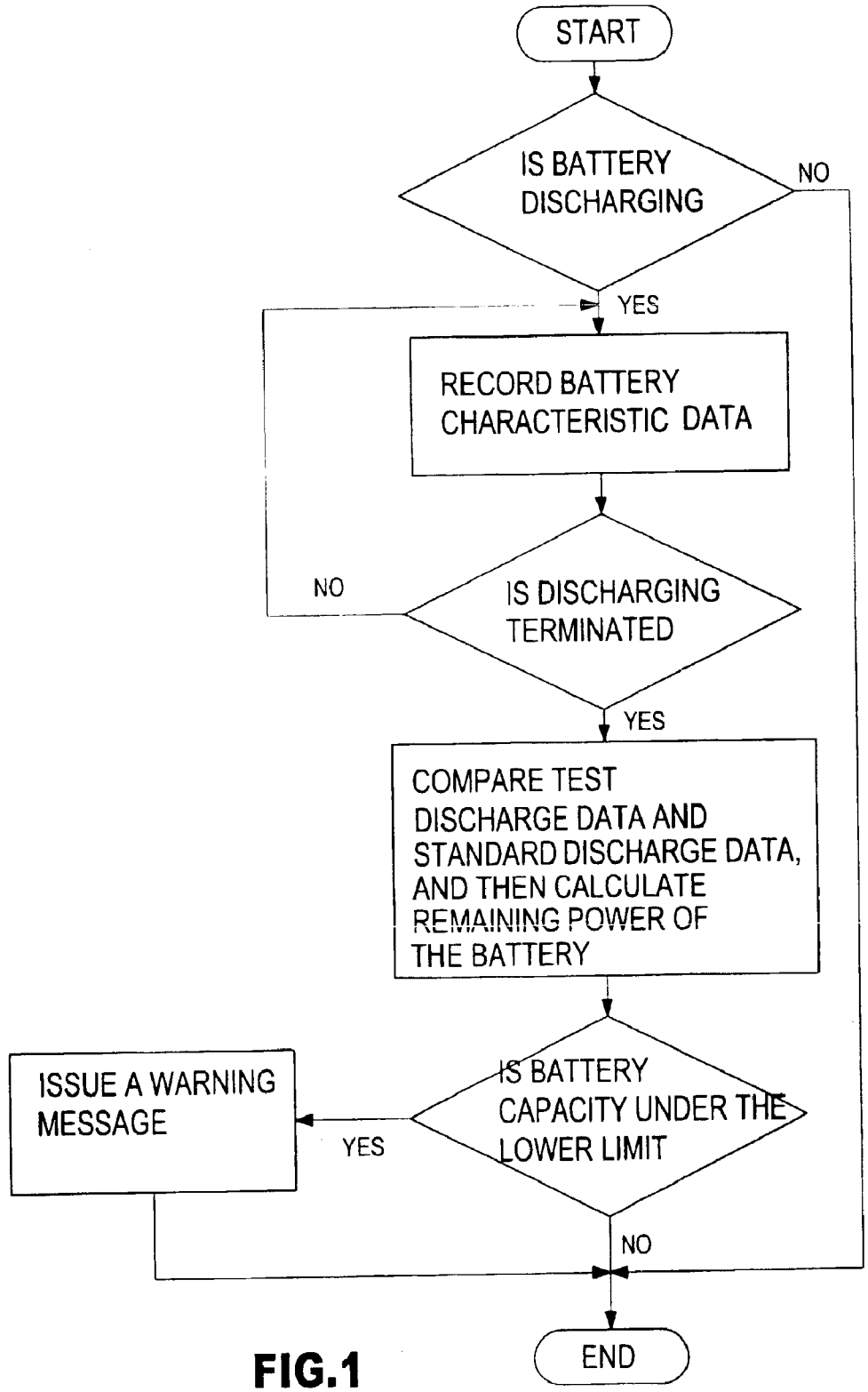
FIG. 1 shows the logical steps for calculating the remaining power capacity in a battery in accordance with the present invention.

The present invention provides a method for checking the power status of a battery set composed of multiple batteries (cells), and the logical process is shown in FIG. 1 comprising the steps of:

determining whether the battery set is in a discharging mode;

collecting discharge data of each battery;

determining whether a battery discharge is terminated;

comparing collected discharge data of each battery with standard discharge data to calculate a remaining power capacity of the battery;

determining whether the remaining power capacity of the battery is below a limit value; and issuing a warning message if the remaining power capacity of the battery is under the limit value.

A description with respect to the logical steps mentioned above is given in more detail. To determine whether the battery set is in the discharge mode, the battery set is hooked up with a monitoring device, either fixed or portable, whilst a random discharge test is carried out on the tested battery set on a continuous basis to determine when the battery set is in the discharge mode. At the same time, the discharge data of each battery of the battery set are collected in every cycle with a predetermined interval using a multi-channel monitoring device, which is able to monitor the discharging operation on multiple connected batteries simultaneously.

When the monitoring device detects that the battery set is in the discharge mode, the device begins to collect the discharge data of each battery, including a terminal voltage, a discharging current, and an operating temperature, in each operation cycle with a predetermined interval.

Figure 2:
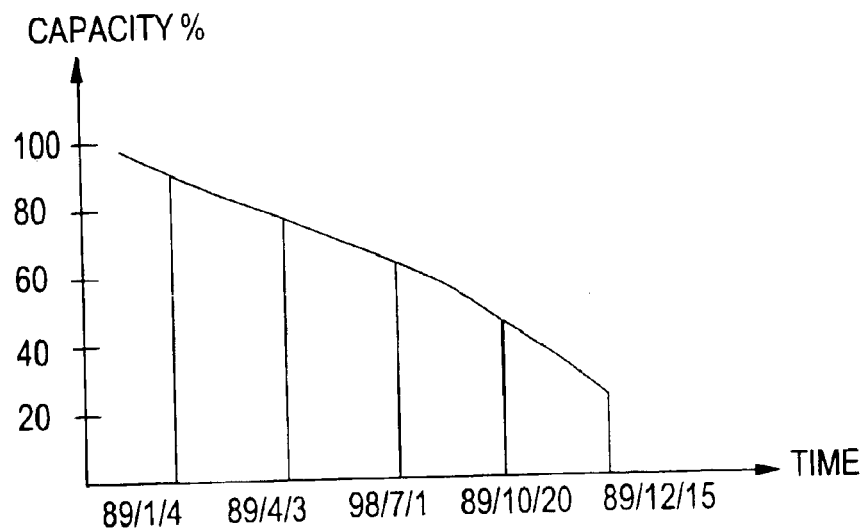
FIG. 2 is a trending curve of battery capacity for a particular battery cell of the battery throughout its service life.
Figure 3:
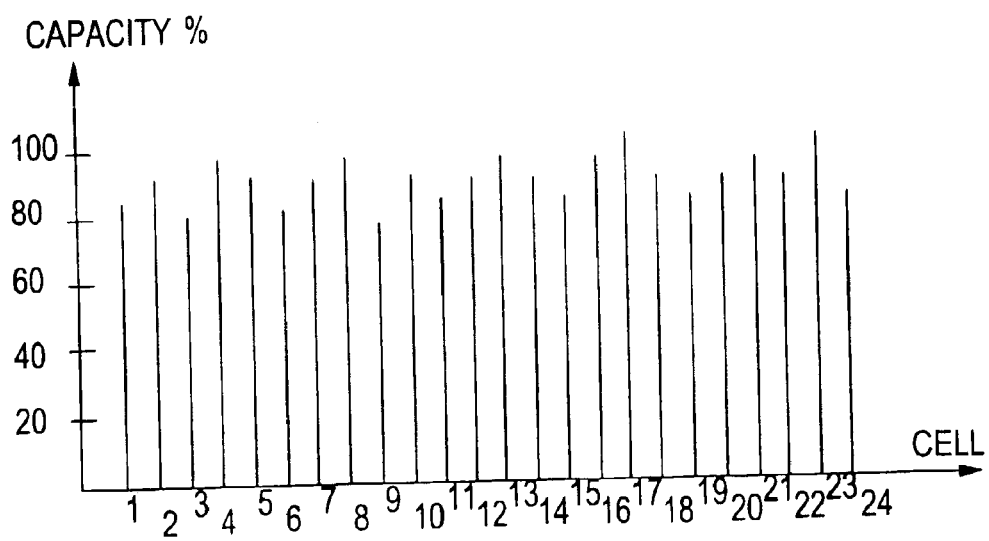
FIG. 3 is a comparative diagram of the storage capacities for different battery cells of the battery.
Figure 4:
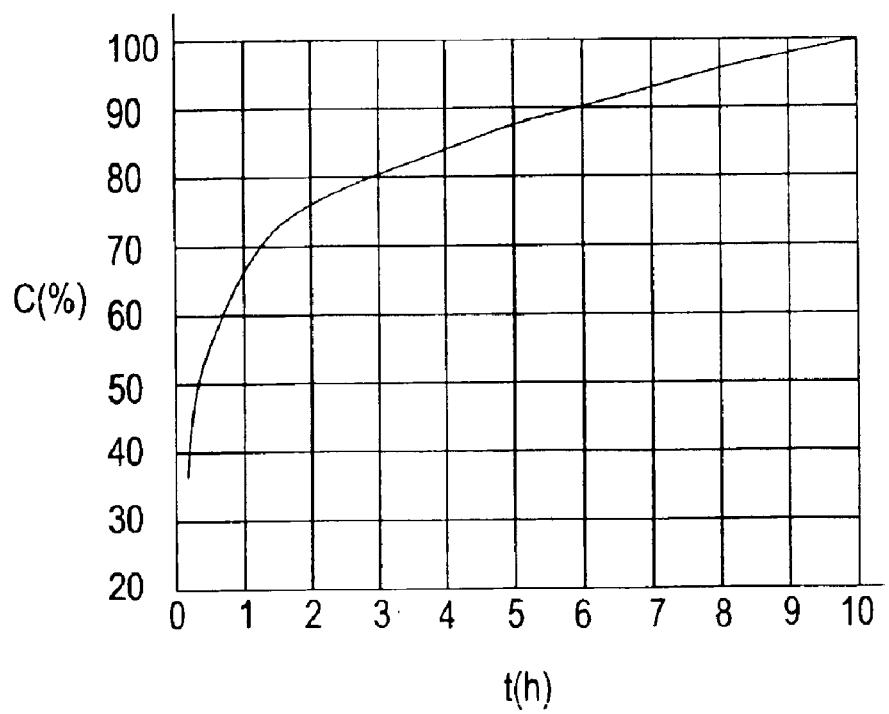
FIG. 4 shows typical characteristics of a conventional battery expressed in battery capacity C(%) and current output t(h).

The above discharge data of the battery is then used for calculating the remaining power capacity. The estimated remaining power capacity for a particular battery will be saved in a standard discharge data base. A trending curve depicting the distribution of remaining power capacity for a particular battery throughout its service life is shown in FIG. 2. With reference to FIG. 3, upon request, this information can be provided to a user, along with a comparative chart of the battery capacity for various types of all batteries. These standard discharge data will be helpful to the person responsible for keeping the storage battery in top operating conditions at all times.

Furthermore, the standard discharge data base is created for saving the discharge data with respect to different types of new batteries, which includes their termination voltage, discharging current, operating temperature and discharging time, along with other relevant data such as their specifications, battery makes, inherent quality, termination voltage, and discharging current. When the monitoring device has collected the discharge data and the discharging time with respect to the tested battery, these data will be compared with the relevant standard discharge data retrieved from the standard discharge data base. An estimation of the remaining power capacity will be calculated for the tested battery. Since the standard discharge data is obtained from a new battery using the same set of conditions, including the battery capacity, terminal voltage and current output, an estimation of the remaining power capacity in the tested battery can be derived from the comparison of the discharge data between the tested battery and the standard discharge data in the data base.

The comparison of discharge data can be implemented in either one-to-several or several-to-several matching. For a one-to-several matching, a computer makes the selection of a set of battery discharge data from the standard discharge data base having the same battery specifications as the tested batteries and uses it for comparison with the discharge data collected from the tested batteries.

For a several-to-several matching, the computer selects more than one set of battery discharge data from the standard discharge data base having the specifications matching the respective tested batteries in the battery set and uses them for comparison with the discharge data collected from the tested batteries. The maximum number of data retrieval at one time is equal to the number of tested batteries of the battery set connected to the monitoring device simultaneously. Specifically, each tested battery is matched against a set of standard discharge data from the data base, but the same set of standard discharge data may be shared by several tested batteries with similar specifications.

Furthermore, there is a positive correlation between the discharging time of a tested battery and the accuracy in the remaining power capacity estimation. The estimation accuracy is improved correspondingly with longer a period of discharging time. For a discharging time occupying more than 6% in a predetermined interval, the estimation accuracy of the remaining power capacity can be improved to within a 10% discrepancy.

Besides the comparison and calculation of the remaining power capacity estimation, the computer is also responsible for checking whether the remaining power capacity of the tested battery is below the limit value; if yes, it will issue a warning message calling for a check-up on the tested battery.

In summary, the present invention first creates a standard discharge data base containing the specifications, discharge data, and discharging time collected from different types of new batteries which will be used as standard characteristic discharge data for the tested batteries of the battery set. The discharge data of a tested battery is then collected in each operation cycle with a predetermined interval and compared with the relevant standard discharge data retrieved from the data base, basing on which a good estimation of the remaining power capacity of the battery can be obtained as the conventional methods have largely ignored the battery capacity factor in their power estimation.

The foregoing description of the preferred embodiments of the present invention is intended to be illustrative only and, under no circumstances, should the scope of the present invention be so restricted.

What is claimed is:

1. A method for checking power status of a battery set having multiple batteries, the method comprising the steps of:

determining whether the battery set is in a discharging mode;

collecting discharge data and a discharging time of each battery;

determining when the discharging mode of the battery is terminated;

comparing collected discharge data of the battery with standard discharge data to calculate a remaining power capacity of the battery; wherein the standard discharge data are obtained from discharge data of different types of new batteries and all the standard data are saved in a standard discharge data base.

2. The method as claimed in claim 1, wherein the standard discharge data is selected by a computer for comparison with the collected discharge data from the battery with one-to-several matching, that is to use one set of the standard discharge data to compare with the collected discharge data of several batteries having similar specifications.

3. The method as claimed in claim 1, wherein the standard discharge data is selected by computer for comparison with the collected discharge data from the batteries with several-to-several matching, that is to use multiple sets of the standard discharge data to compare with multiple sets of collected discharge data from their respective batteries having different specifications.

4. The method as claimed in claim 2, wherein a maximum number of the discharge data to be retrieved in one time for use in discharge data comparison is equal to a number of the batteries of the battery set.

5. The method as claimed in claim 1, wherein after an estimation of the remaining power capacity of the tested battery is produced a subsequent step checks whether the tested battery is below a limit, and issues a warning message calling for battery check-up if the condition is met.

6. The method as claimed in claim 1, wherein the the standard discharge data base can be used to produce a comparative chart of the battery capacity for various types of batteries.

7. The method for as claimed in claim 1, wherein the standard discharge data base can be used to construct a characteristic curve of the battery capacity distribution for a particular type of battery throughout the service life.

8. The method as claimed in claim 1, wherein the discharge data of the battery includes a terminal voltage, a discharging current and an operating temperature.

9. The method as claimed in claim 1, wherein the discharging time of the occupies more than 6% of a predetermined testing period.

\* \* \* \* \*